United States Patent [19]
Fifield et al.

[11] Patent Number: 5,675,774
[45] Date of Patent: Oct. 7, 1997

[54] CIRCUIT ELEMENT ON A SINGLE ENDED INTERCONNECTION FOR GENERATING A LOGICAL OUTPUT FINISH/CLOCK SIGNAL WHEN DETECTING A STATE CHANGE TO LOGICAL "1 OR 0".

[75] Inventors: John Atkinson Fifield, Underhill; Lawrence Griffith Heller, So. Burlington, both of Vt.

[73] Assignee: International Business Machines Corporation, Armonk, N.Y.

[21] Appl. No.: 449,448

[22] Filed: May 24, 1995

[51] Int. Cl.$^6$ .................................. G06F 1/04
[52] U.S. Cl. ..................... 395/551; 395/845; 395/878
[58] Field of Search ................. 178/695 R; 307/269; 370/105.2; 375/8; 364/900; 395/551, 845, 878

[56] References Cited

U.S. PATENT DOCUMENTS

| | | | |
|---|---|---|---|
| 3,967,061 | 6/1976 | Dobias | 178/69.5 R |
| 4,244,051 | 1/1981 | Fujikura et al. | 375/17 |
| 4,302,690 | 11/1981 | Gollinger et al. | 307/451 |
| 4,307,468 | 12/1981 | Beasley et al. | 455/608 |
| 4,468,787 | 8/1984 | Keiper, Jr. | 375/17 |
| 4,504,747 | 3/1985 | Smith et al. | 307/475 |
| 4,583,232 | 4/1986 | Howell | 375/8 |
| 4,694,196 | 9/1987 | Hasley et al. | 307/269 |
| 4,885,582 | 12/1989 | LaBarge et al. | 341/57 |
| 4,897,854 | 1/1990 | Harris et al. | 375/17 |
| 5,027,315 | 6/1991 | Agrawal et al. | 364/900 |
| 5,228,059 | 7/1993 | Takegahara et al. | 375/17 |
| 5,301,196 | 4/1994 | Ewen et al. | 370/105.2 |

Primary Examiner—Thomas C. Lee
Assistant Examiner—David Ton
Attorney, Agent, or Firm—Richard M. Goldman

[57] ABSTRACT

Disclosed is a Data Valid/Finish circuit element, an integrated circuit using the element, and a method of using the element. The circuit element, which may be incorporated in high speed, digital integrated circuit chips, has an input for receiving input from a data stream, and outputs. One of the outputs is an output true for generating a logical "1" when the input is a logical "1". The other output is an output complementary means for generating a logical "1" when the input is a logical "0". The system logically combines the outputs through an output finish/clock for receiving and combining the outputs of the output true and the output complementary. This generates a logical signal when the input from the data stream is either a logical "0" or a logical "1".

9 Claims, 2 Drawing Sheets

CIRCUIT ELEMENT ON A SINGLE ENDED INTERCONNECTION FOR GENERATING A LOGICAL OUTPUT FINISH/CLOCK SIGNAL WHEN DETECTING A STATE CHANGE TO LOGICAL "1 OR 0".

FIELD OF THE INVENTION

This invention relates to a method and circuit element to make a data stream "self-timing" by embedding the CLK or timing signal within the data. This is especially desirable where the actual clock rate or data rate is so high that it becomes difficult to distribute CLK signals.

BACKGROUND OF THE INVENTION

Pre-charge Differential Cascade Voltage Switch circuit elements are commonly used to generate logic finish signals for self timing and self resetting circuits and systems. These circuits require differential wiring for chip to chip interconnections, on chip bussing, and internal macro wiring. Differential wiring can reduce chip and packaging density. However, this is at an increase in cost. Moreover, power is usually increased due to full-rail switching with every state change.

Single ended circuits and interconnections have not been utilized to generate completion signals for random data events because a detectable state change is usually required.

Thus, a need exists for a single ended interface circuit that provides a detectable state change when data arrives, without full rail switching.

OBJECTS OF THE INVENTION

It is one object of the invention to provide a single ended interface circuit that provides a detectable state change when data arrives.

It is a further object of the invention to provide a single ended interface circuit that yields a detectable state change when data arrives without full rail switching. This reduces the AC power.

It is a still further object of the invention to provide an embedded CLK signal in the data stream.

SUMMARY OF THE INVENTION

These and other objects of the invention are accomplished by the Data Valid/Finish circuit element of the invention. The circuit element, which may be incorporated in high speed, digital integrated circuits, has an input for receiving input from a data stream, and outputs. One of the outputs is an "output true" for generating a logical "1" when the input is a logical "1". The other output is an "output complementary" for generating a logical "1" when the input is a logical "0". The system logically combines the outputs through an output finish/clock for receiving and "NORing" or "XORing" the outputs of the "output true" and the "output complementary." This generates a logical signal when the input from the data stream is either a logical "0" or a logical "1".

THE FIGURES

The invention may be understood by the Figures appended hereto.

DETAILED DESCRIPTION OF THE INVENTION

The invention relates to a method and circuit element to make a data stream "self-timing" by embedding the CLK or timing signal within the data. This is especially desirable where the actual clock rate or data rate is so high that it becomes difficult to distribute CLK signals.

Figure 1:
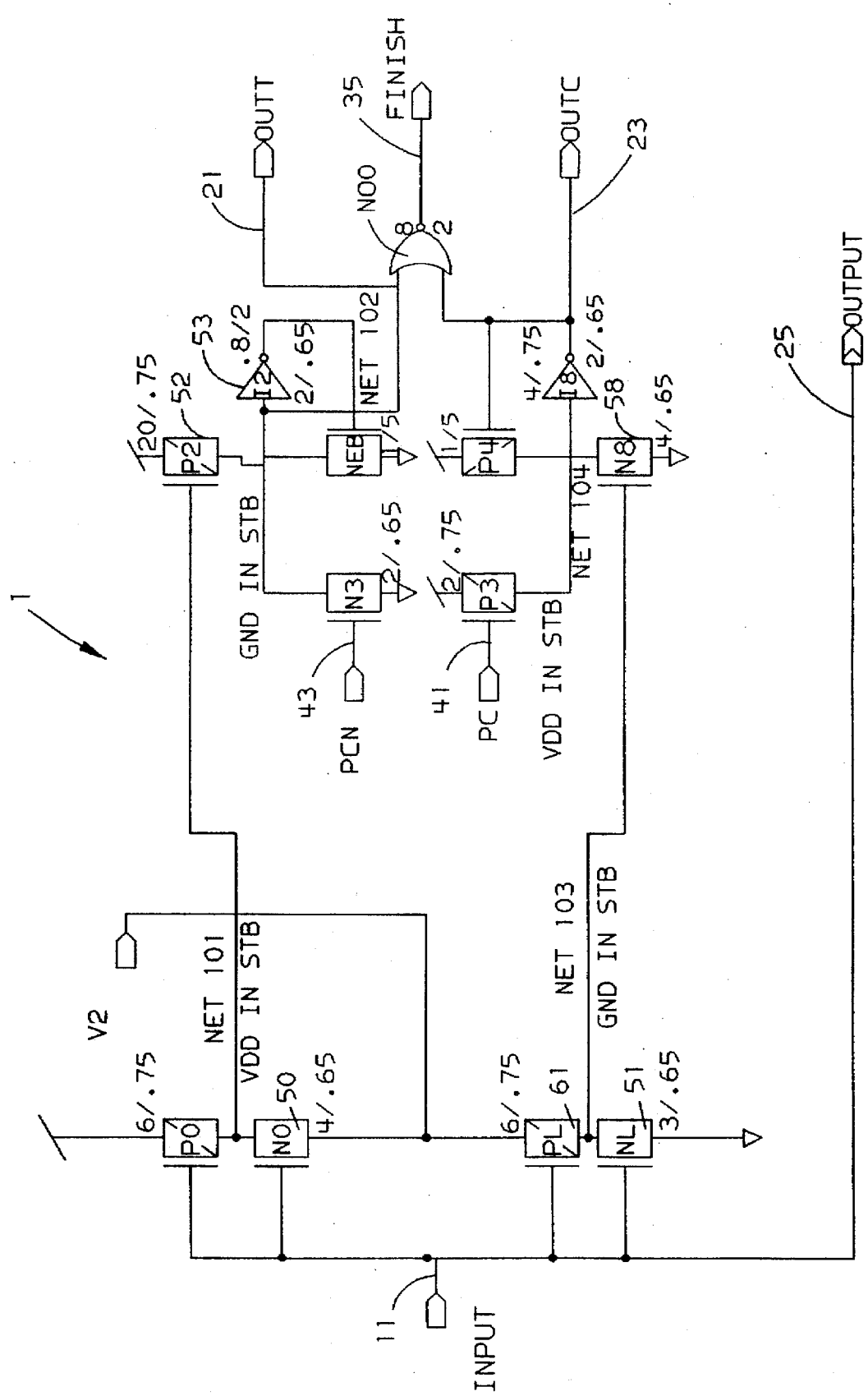
FIG. 1 is a circuit diagram for one embodiment of the invention.

The input to the circuit element 1 is a data stream 11, as shown in FIG. 1. The data stream 11 can assume the values of logical "1" (e.g., Vhigh), logical "0" (e.g., Vground), and a quiescent or "spacer" state intermediate logical "1" and logical "0" (e.g., Vhigh/2).

Various outputs are available from the circuit element 1. These include the differential outputs OUTT 21 and OUTC 23. OUTT, 21, also called "Output True" is high for input 11 equals logical "1". OUTC, also called "Output Complementary" is high for Input 11 equals "0". This is called "dual rail monotonic output" which goes full rail (Vhigh) for either "0" or "1".

The system also has a "NOR" gate 33. When the NOR gate 33 fires, the outputs of OUTC, 23, OUTT, 21, and the straight through output, OUTPUT, 25, are all valid. This NOR gate 33 internally generates the CLK that determines the validity of the output, 21, 23, 25. The purpose of the "NOR" gate is to logically combine OUTT 21 and OUTC 23, such that the "NOR" gate fires only when one of OUTT or OUTC is high. This can also be done with an "XOR" gate.

The input 11 to the circuit 1 shown in FIG. 1 has three states, "1", "0", and a quiescent or precharge state. The quiescent state, $V_R$, is an intermediate level between $V_{dd}$ and Ground. A "1" is a positive level some delta V above $V_R$, and a "0" is a negative level delta between $V_R$ and Ground. Prior to data arrival the input is set to a precharge level, $V_R$, for example $V_{dd}/2$. Network 101 is set through transistor P0 to $V_{dd}$, and network 103 is grounded through transistor 51. Assume that $V_2$ equals $V_{dd/2}$. Devices 41, and 43, set network 104 to $V_{dd}$, the input to invertor 53 to ground, and the NOR gate inputs OutTrue and OutComplementary low.

When node 104 goes high and OUTT 21 is grounded, they are set in their precharge states by soft feedback latches, and the circuit, 1, is ready to detect data.

Figure 2:
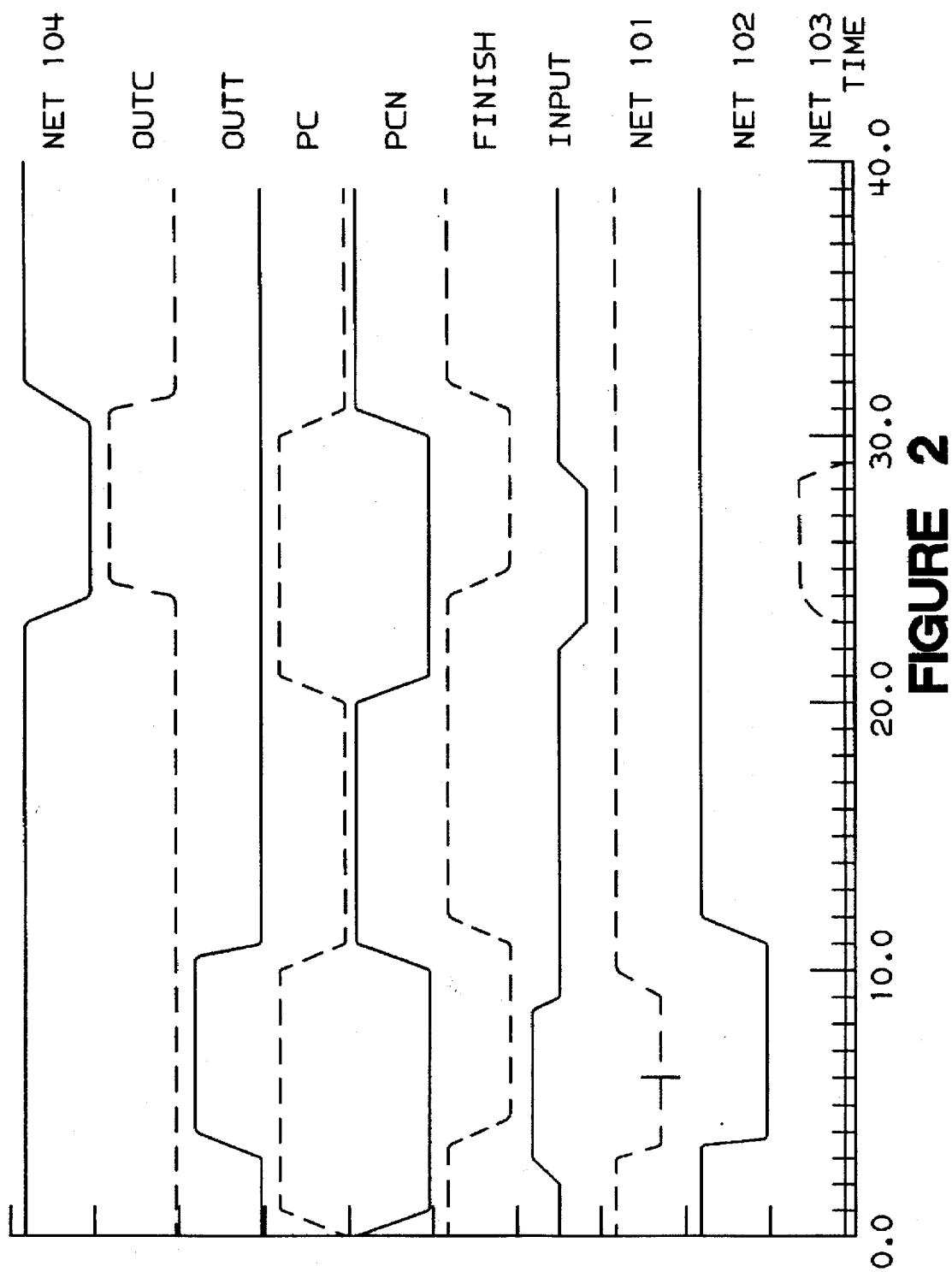
FIG. 2 is a timing diagram for the circuits shown in FIG. 1.

FIG. 2 shows the waveforms, first for a "1" input, and then for a "0" input. For purposes of illustration, a "1" is a positive pulse, and a "0" is a negative pulse, both of amplitude $V_{dd/2}$. A "1" turns on transistor 50, discharging network 101 to $V_2$, turns on transistor 52, and OutTrue goes high, firing the NOR gate 33 to generate Finish 35.

A "0" input turns on transistors 61 and 58, OutComplementary input goes high, firing the NOR gate. When Finish 35 goes low, differential outputs OutTrue 21 and OutComplementary 23, and the single ended output 25 are all valid and full rail.

To be noted is that if the input swing is less than full rail, the AC power of the interconnect can be reduced considerably. Outputs OutTrue 21 and OutComplementary 23 can each drive circuits directly.

The method and structure of the invention provides for detecting and generating a finish signal on a single ended interconnection.

The operating sequence is that the input to the element is initially intermediate or quiescent, and PC is low and PCN is high. This pulls output complementary, OUTC, 23, and output true, OUTT, 21, to ground, and OUTPUT, 25, to quiescent. When PC and PCN reverse phase and when data arrives, INPUT 11 is either Vhigh or Vground, driving the appropriate one of OUTC 23 or OUTT 21 to Vhigh. This fires the NOR gate, 33, which indicates valid data.

This is accomplished with the Data Valid/Finish circuit element 1 of the invention. The circuit element 1 has an input 11 from a data stream, "output true", 21, "output complementary", 23, and "output finish/valid/clock" subelements. The output true subelement generates a logical "1" while the input 11 is a logical "1". The output complementary subelement generates a logical "1" while the input data stream is a logical "0". The output finish/clock/valid subelement receives and "NORs" the outputs of the output true subelement and the output complementary subelement, and generates a logical "0" when the input from the data stream is either a logical "0" or a logical "1". This logical "0" is a data valid and a clock signal.

One such element is provided for each line in the data, address, or control bus.

While the invention has been described with respect to certain preferred embodiments and exemplifications, it is not intended to limit the claims thereby, but solely by the claims appended hereto.

We claim:

1. A Data Valid/Finish circuit element on a single ended interconnection for detecting a state change to a logical "1" or logical "0" and generating a finish signal therefrom, said circuit element comprising:
   a. input means for receiving input from a data stream;
   b. output true means for generating a logical "1" while the input on said means for receiving input from a data stream is a logical "1";
   c. output complementary means for generating a logical "1" while the input on said means for receiving input from a data stream is a logical "0";
   d. output finish/clock means for receiving and combining the outputs of the output true means and the output complementary means, and generating a logical output finish/clock signal when the input from the data stream is either a logical "0" or a logical "1".

2. The circuit element of claim 1 wherein the output finish/clock means for receiving and combining the outputs of the output true means and the output complementary means, and generating a logical output finish/clock signal when the input from the data stream is either a logical "0" or a logical "1" is a NOR gate.

3. The circuit element of claim 1 wherein the output finish/clock means for receiving and combining the outputs of the output true means and the output complementary means, and generating a logical output finish/clock signal when the input from the data stream is either a logical "0" or a logical "1" is an XOR gate.

4. An integrated circuit having a Data Valid/Finish circuit element on a single ended interconnection for detecting a state change to a logical "1" or logical "0" and generating a finish signal therefrom, said circuit element comprising:
   a. input means for receiving input from a data stream;
   b. output true means for generating a logical "1" while the input on said means for receiving input from a data stream is a logical "1";
   c. output complementary means for generating a logical "1" while the input on said means for receiving input from a data stream is a logical "0";
   d. output finish/clock means for receiving and combining the outputs of the output true means and the output complementary means, and generating a logical output finish/clock signal when the input from the data stream is either a logical "0" or a logical "1".

5. The integrated circuit of claim 4 wherein the output finish/clock means for receiving and combining the outputs of the output true means and the output complementary means, and generating a logical output finish/clock signal when the input from the data stream is either a logical "0" or a logical "1" is an XOR gate.

6. The integrated circuit of claim 4 wherein the output finish/clock means for receiving and combining the outputs of the output true means and the output complementary means, and generating a logical output finish/clock signal when the input from the data stream is either a logical "0" or a logical "1" is a NOR gate.

7. A method of recovering a CLK signal from a data stream comprising the steps of:
   a. receiving an input from the data stream;
   b. generating in a logical true means a logical "1" while the input is a logical "1";
   c. generating in a logical complementary means a logical "1" while the input is a logical "0";
   d. receiving and combining the outputs of the logical true means and the logical complementary means, and generating a logical CLK signal when the input from the data stream is either a logical "0" or a logical "1".

8. The method of claim 7 receiving and combining in a XOR gate the outputs of the logical true means and the logical complementary means, and generating a logical CLK signal when the input from the data stream is either a logical "0" or a logical "1".

9. The method of claim 7 receiving and combining in a NOR gate the outputs of the logical true means and the logical complementary means, and generating a logical CLK signal when the input from the data stream is either a logical "0" or a logical "1".

* * * * *